United States Patent [19]

Moulton et al.

[11] 4,302,732

[45] Nov. 24, 1981

[54] HARMONIC PHASE LOCKED LOOP WITH UNDESIRED DC COMPONENT SUPPRESSION

[75] Inventors: Robert K. Moulton, North Wales; John W. Thompson, Willow Grove, both of Pa.

[73] Assignee: Sperry Corporation, New York, N.Y.

[21] Appl. No.: 55,885

[22] Filed: Jul. 9, 1979

[51] Int. Cl.³ .............................................. H03L 1/00
[52] U.S. Cl. .................................. 331/176; 331/1 A; 331/18
[58] Field of Search .................... 331/17, 18, 25, 16, 331/1 A, 1 R, 32, 74, 176

[56] References Cited

U.S. PATENT DOCUMENTS 3,886,472 11/1973 Cottatellucci ......................... 331/18
3,921,093 11/1975 Lewis .................................... 331/32

Primary Examiner—David K. Moore

Attorney, Agent, or Firm—Thomas J. Scott; William E. Cleaver; Edward M. Farrell

[57] ABSTRACT

The output signal of a voltage-controlled oscillator of a phase-locked loop has its phase compared with the phase of incoming data in a phase detector producing a first signal. This first signal is then passed through a non-inverting amplifier to produce an amplified signal of the same polarity. The first signal is also passed through an inverting amplifier otherwise similar to the non-inverting amplifier to produce an amplified signal of opposite polarity. The inverted and non-inverted amplified signals are then filtered in respective low pass filter circuits and combined differentially in an amplifier which produces an error voltage for the voltage-controlled oscillator. Differential combining of the inverted and non-inverted amplified signals eliminates undesired D.C. voltage components caused by temperature drifts and the like by mutually cancelling such components while effectively doubling the amplitude of the desired error voltage.

6 Claims, 3 Drawing Figures

HARMONIC PHASE LOCKED LOOP WITH UNDESIRED DC COMPONENT SUPPRESSION

TECHNICAL FIELD

This invention relates generally to phase detectors of the hybrid type, i.e., circuits comprising digital components which operate in analog fashion, and in particular to harmonic phase-locked loops with improved suppression of undesired DC components.

BACKGROUND ART

A typical phase-locked loop includes a voltage-controlled oscillator which produces a clock output as well as an output signal which is fed to a phase detector for comparison with an input signal. The output of the phase detector is then filtered and fed back as an error signal to control the voltage-controlled oscillator.

In prior art phase locked loops, the threshold of the amplifier has been designed so as to amplify the average varying DC voltage component of the output of the phase detector and thereby produce a beat frequency signal when the loop is operating in an out-of-lock condition. Typical of these designs is the requirement to adjust the threshold of the amplifier so as not to amplify the undesired DC components which may be caused by circuit imbalances. These imbalances are produced by variations in temperature, supply voltage drift or aging of the circuit components.

Other prior art phase-locked loops feature a non-harmonic phase detector for signal acquisition and a harmonic type phase detector which is switched in to maintain lock during processing of complex data patterns. This dual phase detector scheme is partially required by the above-described circuit imbalances.

Still other conventional phase-locked loops are characterized by the production of a low-amplitude beat frequency signal at the output of the phase detector which, due to these circuit imbalances, makes signal acquisition in the loop a precarious procedure.

DISCLOSURE OF THE INVENTION

The phase of a voltage-controlled oscillator signal is compared with an incoming data signal, to produce a first signal. The first signal is inverted and amplified to provide an amplified signal of opposite polarity. The non-inverted first signal is amplified to provide an amplified signal of the same polarity. The two signals of different polarities are separately passed through respective low pass filters to a differential amplifier. The output signal from the differential amplifier is the error or control voltage signal which is the voltage-controlled oscillator signal that is compared with the incoming data signal.

A novel feature of the subject invention is suppression of the undesired D.C. component produced by circuit imbalances. This component which is produced as a result of temperature variations, voltage supply drift, loading or other circuit variations in the phase-locked loop may cause circuit impedances to vary and produce changes in the circuit parameters. Therefore, an undesired D.C. component generated in the elements of the phase-locked loop circuit itself will be coupled into the amplifier and applied as an undesired component of the error voltage to the voltage controlled oscillator. As a result, the clock output from the voltage controlled oscillator will be incorrect.

DETAILED DESCRIPTION OF THE INVENTION

In a preferred embodiment of this invention mutual cancellation of undesired D.C. components is achieved by using a parallel circuit comprising an inverting amplifier and filter in one branch and a non-inverting amplifier and filter in the other branch. The elements in the parallel circuit are matched to provide balance between the branches of the circuit. In order to obtain even more perfect balance in this preferred embodiment, the inverting and non-inverting amplifiers selected were two exclusive OR circuits formed on the same integrated circuit or "chip".

Figure 1:
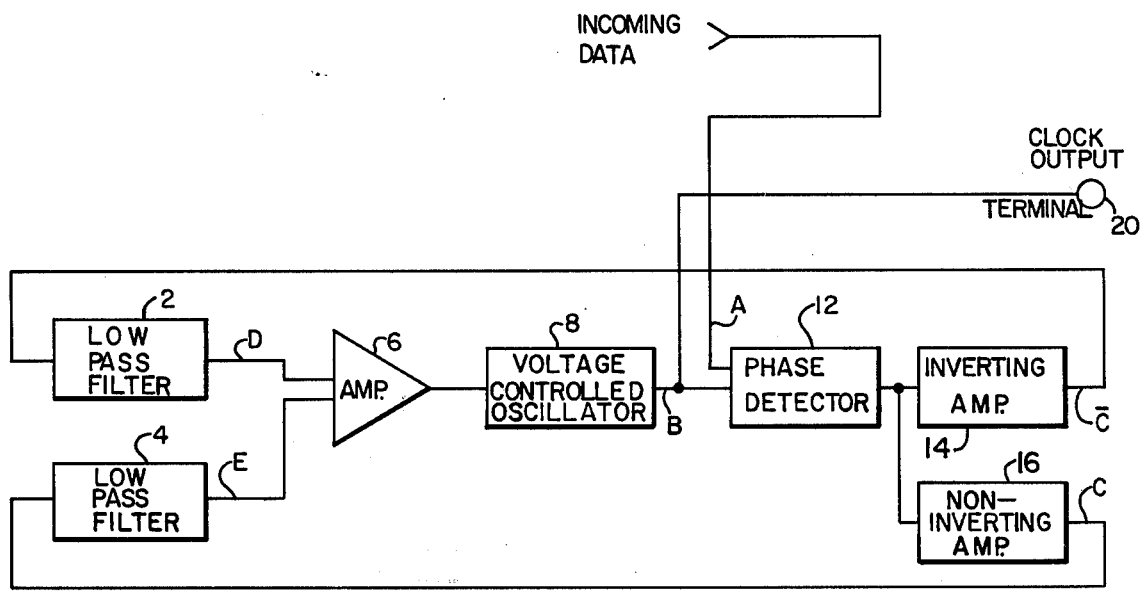
FIG. 1 is a block diagram illustrating the novel phase-locked loop according to the present invention.
Figure 2:
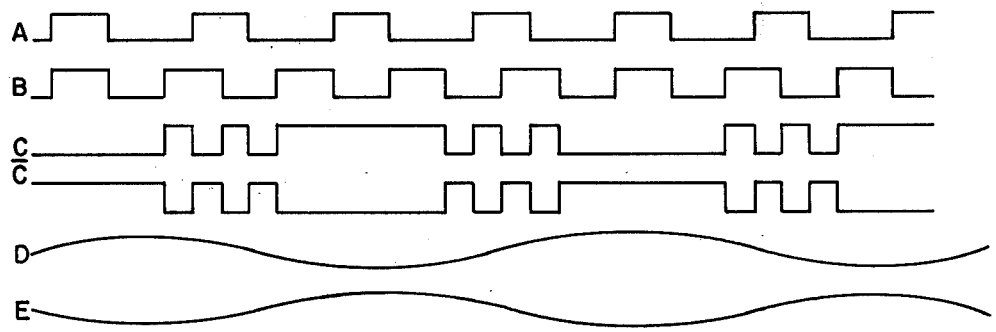
FIG. 2 is a set of waveforms depicting the signals as they appear at various correspondingly-lettered points on FIG. 1.

Referring to FIG. 1, input data signals such as the pulse train shown at A of FIG. 2, are applied to one input to a harmonic phase detector 12. The output signal from a voltage-controlled oscillator 8 is applied to the other input of the phase detector 12. The phase detector 12 produces an output signal which is coupled to an inverting amplifier 14 and a non-inverting amplifier 16. In order to obtain more perfect balance, the amplifiers 14 and 16 may be two exclusive OR circuits formed on the same integrated circuit.

The output signals of the amplifier 14 and 16 take the form shown in waveforms $\overline{C}$ and C, if they are exclusive OR circuits. Further these signals will have respective average voltage amplitudes proportional to the relative phase difference between the two signals applied to the phase detector. When the loop is in an out-of-lock condition, the output signal of each of the amplifiers 14 and 16 is a varying amplitude waveform which has a beat frequency derived from the frequency difference between the input waveforms to the phase detector 12. Signals $\overline{C}$ and C are applied to respective low pass filter circuits 2 and 4 which may be passive type filters although active filters may also be used. Since these filters 2, 4 have integrating components, their respective output signals will take the forms shown in waveforms D and E. Thus, the two output signals from the filters 2, 4 having equal amplitudes but opposite polarities are applied to the corresponding input terminals of a differential amplifier 6. Any undesired D.C. component produced as a result of supply voltage drift, loading or circuit variation in the phase-locked loop which is present in the output signals from the filters 2, 4 will not appear as a positive D.C. component in waveform D and as a negative D.C. component in waveform E. Rather, any undesired D.C. component in the output signals from the filters 2,4 will appear either as a positive D.C. component in both waveforms D and E or as a negative D.C. component in both waveforms D and E. Accordingly, when the waveforms D and E are applied to the respective inputs of the differential amplifier 6 the desired components of waveform D are inverted because the waveform D is applied to the inverting terminal of the differential amplifier 6. As a result, when the waveforms are algebraically combined to provide an amplifier output signal having twice the amplitude of the input waveforms D and E, the undesired D.C. component in the waveform D is inverted and algebraically combined with the undesired D.C. component in the waveform E so that they cancel each other out and the undesired D.C. component is suppressed.

During acquisition, the beat frequency of the waveforms D and E decreases in frequency approaching zero as phase lock is achieved. During phase lock, the amplifier 6 amplifies only the D.C. difference error voltage between the outputs $\overline{C}$ and C of the two amplifier circuits 14 and 16. In so doing, this circuit assures that the loop will always obtain lock because there will be no undesired D.C. components present at the input of the voltage controlled oscillator to produce an error in the clock output signal which is applied to a clock output terminal 20 as well as to phase detector 12.

Figure 3:
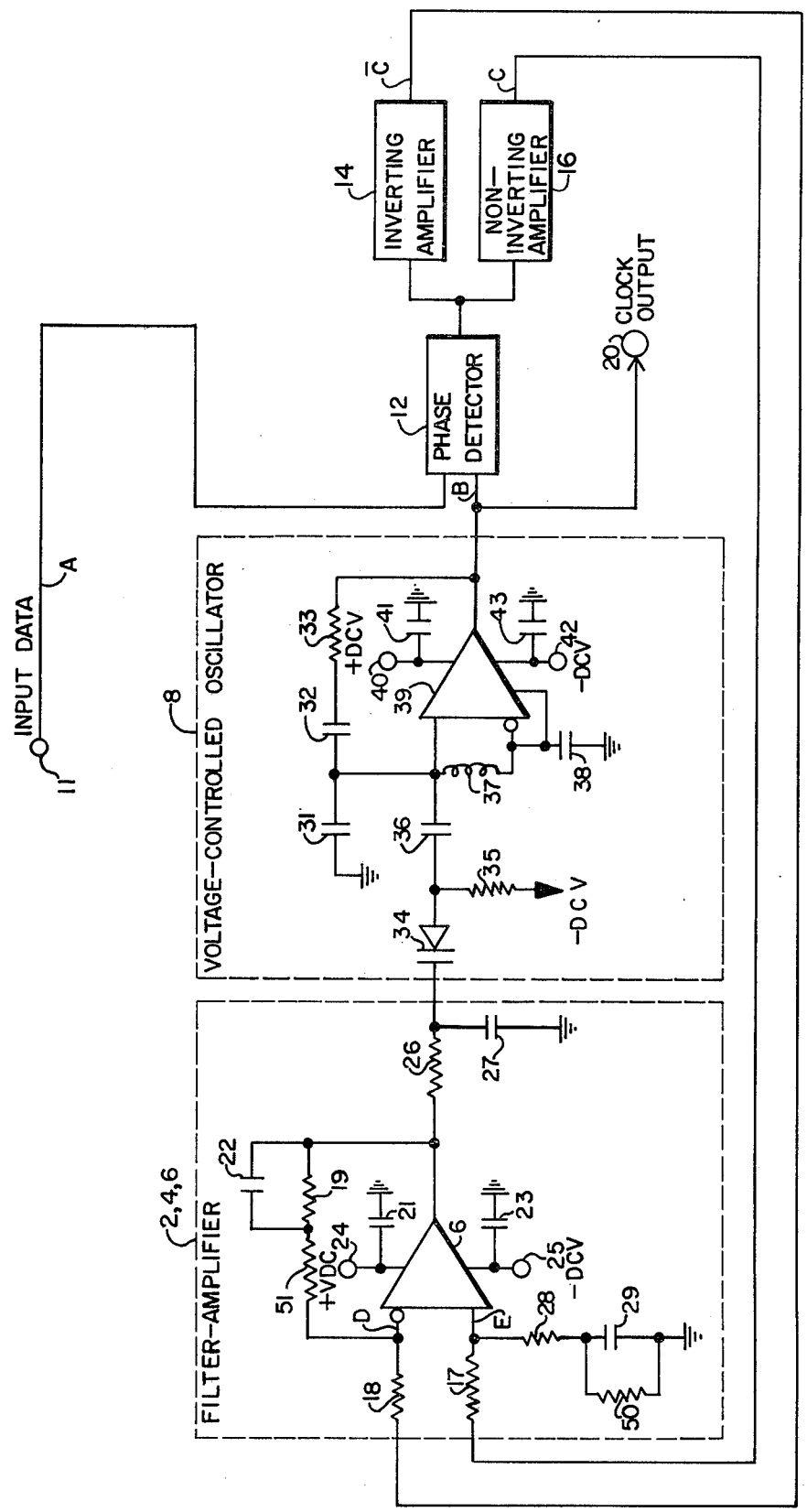
FIG. 3 is a schematic diagram corresponding to FIG. 1.

FIG. 3 is a schematic diagram of the preferred embodiment of the present invention and corresponds to the block diagram of FIG. 1. The waveform (A) is representative of the input data signal that is applied as one input to the harmonic phase detector 12. The waveform (B) is representative of the output signal from the voltage controlled oscillator 8 which is applied to the other input of this phase detector 12. The waveform (B) is also connected to a clock output terminal 20. The output signal produced by the phase detector 12 is applied to the input terminals of an inverting amplifier 14 and a non-inverting amplifier 16.

The waveforms ($\overline{C}$ and C) are representative of the output signals provided by amplifiers 14 and 16 which are coupled via resistors 18 and 17 respectively to corresponding low-pass filter circuits. Resistor 18 is a filter resistor which cooperates with resistors 51, 19 and capacitor 22 to form a low-pass filter circuit that produces an output signal represented by waveform D. Similarly, resistor 17 together with resistors 28, 50 and capacitor 29 form a low-pass filter circuit that produces an output signal represented by waveform E. Waveforms D and E are the respective integrated forms of waveforms $\overline{C}$ and C and have smooth, low frequency appearances which are substantially equal in amplitude but opposite in polarity to one another.

The output of the amplifier 6 is connected to a load resistor 26 whose other terminal is connected via a filter capacitor 27 to ground and to a first terminal on a variable capacitance diode 34. The second terminal of the diode 34 is part of the voltage-controlled circuit oscillator 8 and is coupled through a capacitor 36 to one input of an amplifier 39. The electrical junction of the diode 34 and the capacitor 36 is connected via a coupling resistor 35 to a source of a negative D.C. voltage.

Coupled between the inverting and non-inverting input terminals of the amplifier 39 is a coil 37 used to tune the oscillator 8. The inverting input terminal of the amplifier 39 is also bypassed via a filter capacitor 38 to ground. The series arrangement of capacitors 31, 32 and resistor 33 is connected between the output of amplifier 39 and ground. The junction of capacitors 31 and 32 is connected to the non-inverting input terminal of the amplifier 39.

The output waveform (B) of the oscillator 8 is applied to one input terminal of the phase detector 12 as explained previously. The embodiment shown in FIG. 3 was constructed and worked successfully when the various components thereof had the following exemplary values and characteristics:

| | |
|---|---|
| 6 | LM318 |
| 12 | 74S86 |
| 17 | 2K Ohms |
| 18 | 2K Ohms |
| 19 | 62K Ohms |
| 21 | 0.1 mfd |
| 22 | 0.1 mfd |
| 23 | 0.1 mfd |
| 24 | +5 V DC |
| 25 | −5.2 V DC |
| 26 | 51 Ohms |
| 27 | 1000 pf |
| 28 | 400 Ohms |
| 29 | 0.1 mfd |
| 31 | 68 pf |
| 32 | 15 pf |
| 33 | 200 Ohms |
| 34 | MV840 |
| 35 | 20K Ohms |
| 36 | 470 pf |
| 37 | 0.22 microhenries |
| 38 | 0.1 mfd |
| 39 | MC10125 |
| 40 | +5 DC |
| 41 | 0.1 mfd |
| 42 | −5.2 V DC |
| 43 | 0.1 mfd |
| 48 | 74S86 |
| 49 | 74S86 |
| 50 | 62K Ohms |
| 51 | 400 Ohms |

A variation of the present invention involves the substitution of inverting and non-inverting EXOR circuits for amplifiers 14 and 16. Still another variation would employ two matched harmonic phase detectors such as two EXOR's on a single chip to which an inverted and a non-inverted form of the output wave of the controlled oscillator are separately applied. In this form, the output waves of the EXOR's are filtered and applied to a differential amplifier.

While the invention has been described in its preferred embodiment, it is to be understood that the words which have been used are words of description rather than limitation and that any changes made within the purvue of the appended claims may be made without departing from the true scope and spirit of the invention in its broader aspects.

We claim:

1. A phase-locked loop comprising:
voltage-controlled oscillator means for producing a clock output signal having a frequency in accordance with an applied error control voltage signal,
phase detector means coupled to said oscillator means for comparing said clock output signal with an incoming data signal and producing a first signal having an average voltage amplitude proportional to the phase difference between the clock output signal and the incoming data signal,
first amplifying means coupled to said phase detector means for amplifying without inverting said first signal, second amplifying means also coupled to said phase detector means in parallel with said first amplifying means for amplifying and inverting said first signal,
first filter means coupled to said first amplifying means for producing a first low-frequency signal by extracting the low-frequency components from said non-inverted amplified first signal,
second filter means coupled to said second amplifying means for producing a second low-frequency signal by extracting the low-frequency components from said inverted, amplified first signal, and combining means coupled to said first and second filter means for differentially combining said low-frequency signals to produce said applied error control voltage signal having an amplitude which is substantially equal to the sum of the voltage amplitudes of said first and second low-frequency signals and any undesired D.C. voltage components present in the low-frequency signals have been mutually cancelled out.

2. A phase-locked loop as recited in claim 1 in which said phase detector means includes an harmonic phase detector.

3. A phase-locked loop as recited in claim 1 in which the output circuitry said phase detector means is a single-ended circuit means.

4. A phase-locked loop as recited in claim 1 in which said combining means includes differential amplifier means for algebraically combining said low frequency signals whereby undesired D.C. components present in said low frequency signals are mutually cancelled out.

5. A method for cancelling undesired D.C. components present in a phase-locked loop comprising the steps of:

producing an oscillatory signal whose frequency or phase is responsive to a control voltage, comparing the phase of said oscillatory signal with the phase of incoming data signals thereby producing a first signal, inverting said first signal to produce a second inverted signal, extracting predetermined low frequency components of said first signal, extracting predetermined low frequency characteristics of said second inverted signal, differentially combining said extracted low frequency components of said first and second signals thereby producing a resultant signal in which unwanted D.C. components have mutually been cancelled out, and applying said resultant signal as the control voltage of said oscillator.

6. The method as recited in claim 5 wherein said step of extracting predetermined low frequency components of said first signal and said step of extracting predetermined low frequency components of said second signal includes the step of filtering said first signal and said second inverted signal in a low pass filtering means.

* * * * *